(12) United States Patent
da Silva et al.

(10) Patent No.: US 8,643,518 B2
(45) Date of Patent: Feb. 4, 2014

(54) CALIBRATION OF TIME CONSTANTS IN A CONTINUOUS-TIME DELTA-SIGMA CONVERTER

(75) Inventors: José Barreiro da Silva, Woburn, MA (US); Jeffrey Carl Gealow, Andover, MA (US); Patrick Stanley Riehl, Cambridge, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 40 days.

(21) Appl. No.: 13/277,238

(22) Filed: Oct. 20, 2011

(65) Prior Publication Data

US 2012/0169521 A1 Jul. 5, 2012

Related U.S. Application Data

(60) Provisional application No. 61/428,274, filed on Dec. 30, 2010.

(51) Int. Cl.
*H03M 1/10* (2006.01)

(52) U.S. Cl.
USPC ............ 341/120; 341/118; 341/143; 341/155

(58) Field of Classification Search
USPC .................................. 341/118, 120, 143, 155
See application file for complete search history.

(56) References Cited

U.S. PATENT DOCUMENTS

| | | | |
|---|---|---|---|
| 6,977,601 B1 * | 12/2005 | Fletcher et al. ............... | 341/143 |
| 7,193,546 B1 * | 3/2007 | Melanson ..................... | 341/143 |
| 7,221,302 B1 * | 5/2007 | Melanson ..................... | 341/143 |
| 7,324,028 B2 * | 1/2008 | Hsieh et al. ................... | 341/120 |
| 7,525,465 B1 * | 4/2009 | Elwan et al. .................. | 341/143 |
| 7,626,526 B2 * | 12/2009 | Philips .......................... | 341/143 |
| 7,944,385 B2 * | 5/2011 | Le Guillou .................... | 341/143 |
| 8,159,378 B2 * | 4/2012 | Heo et al. ..................... | 341/120 |
| 8,174,419 B2 * | 5/2012 | Adamo et al. ................ | 341/141 |
| 8,350,737 B2 * | 1/2013 | Sanduleanu et al. .......... | 341/120 |
| 2003/0146862 A1 * | 8/2003 | Gandolfi et al. .............. | 341/120 |
| 2004/0201508 A1 * | 10/2004 | Krone et al. ................... | 341/143 |
| 2008/0062032 A1 * | 3/2008 | Park et al. ..................... | 341/158 |
| 2010/0073208 A1 | 3/2010 | Karthaus | |
| 2010/0219997 A1 * | 9/2010 | Le Guillou .................... | 341/143 |

OTHER PUBLICATIONS

"International Search Report" mailed on Mar. 16, 2012 for International application No. PCT/US11/58195, International filing date:Oct. 28, 2011.

Xia, "An RC Time Constant Auto-Tuning Structure for High Linearity Continuous-Time Sigma-Delta Modulators and Active Filters", 2004, pp. 2179-2188, IEEE.

(Continued)

*Primary Examiner* — Linh Nguyen (74) *Attorney, Agent, or Firm* — Winston Hsu; Scott Margo (57) ABSTRACT

A circuit for calibrating selective coefficients of a delta-sigma modulator is provided. The circuit includes a calibration logic module that is coupled to one of a plurality of stages of the delta-sigma modulator. The calibration logic module measures the oscillating frequency of a respective stage and compares it to a reference frequency. The calibration logic adjusts a selective circuit component associated with the respective stage so that the reference frequency and the oscillating frequency match.

22 Claims, 8 Drawing Sheets

(56) References Cited

OTHER PUBLICATIONS

Loke, "A 400-MHZ 4TH-Order CT Bandpass Sigma-Delta Modulator With Automatic Frequency Tuning", 2005, pp. 24-27, IEEE.
Mitteregger, "A 20-mW 640-MHz CMOS Continuous-Time Sigma-Delta ADC With 20-MHz Signal Bandwidth,80-dB Dynamic Range and 12-bit ENOB", 2006, pp. 2641-2649, IEEE.
Pavan, "Automatic Tuning of Time Constants in Continuous-Time Delta—Sigma Modulators", 2007, pp. 308-312, IEEE.
Choi, "A 101-dB SNR Hybrid Delta-Sigma Audio ADC using Post Integration Time Control", 2008, pp. 89-92, IEEE.
Cho-Ying Lu et al., "A Sixth-Order 200 MHz IF Bandpass Sigma-Delta Modulator With Over 68 dB SNDR in 10 MHz Bandwidth", 2010, pp. 1122-1136, IEEE.

* cited by examiner

CALIBRATION OF TIME CONSTANTS IN A CONTINUOUS-TIME DELTA-SIGMA CONVERTER

CROSS REFERENCE TO RELATED APPLICATIONS

This application claims priority from U.S. Provisional Application Ser. No. 61/428,274 filed Dec. 30, 2010, which is incorporated herein by reference in its entirety.

BACKGROUND

Delta-sigma data converters or noise-shaping oversampling converters are preferred in many analog-to-digital conversion (ADC) applications because of their ability to exchange bandwidth and accuracy. For most of their history, delta-sigma converters were implemented as discrete-time architectures. More recently, continuous-time implementations are becoming preferred because of lower power consumption, reduced sensitivity to noise, and inherent anti-aliasing properties.

Most discrete-time implementations rely on switched-capacitor circuit techniques, and their loop coefficients are based on inherently accurate capacitor ratios. In contrast, for continuous-time delta-sigma converters, the loop coefficients are implemented as products of resistor (or transconductance) and capacitor values (RC-based time constants). These components are difficult to implement accurately during IC fabrication. It is common for RC products to vary by ±30% or more, while accuracies within ±5% are typically required to attain the desired performance targets. Therefore, a calibration technique is required for accurate control of these RC products.

One calibration technique used involved configuring an RC-based circuit as a relaxation oscillator. It requires a comparator as the only additional analog component. The frequency of oscillation depends on the RC product, and it is compared to an accurate reference frequency. The resistor or capacitor is implemented as a trimmable array, and its effective value can be adjusted, for example by a successive-approximation algorithm, until the oscillation frequency matches the reference frequency.

SUMMARY

According to one aspect of the invention, there is provided a circuit for calibrating selective coefficients of a delta-sigma modulator. The circuit includes a calibration logic module that is coupled to one of a plurality of stages of the delta-sigma modulator. The calibration logic module measures the oscillating frequency of a respective stage and compares it to a reference frequency. The calibration logic adjusts a selective circuit component associated with the respective stage so that the reference frequency and the oscillating frequency match.

According to another aspect of the invention, there is provided a method of calibrating selective coefficients of a delta-sigma modulator. The method includes receiving an oscillating frequency of a respective stage and a reference frequency. Also, the method includes coupling a plurality of stages of the delta-sigma modulator to a calibration logic module. The calibration logic module measures the oscillating frequency of the respective stage and compares it to the reference frequency. The calibration logic adjusts a selective circuit component associated with the respective stage so that the reference frequency and the oscillating frequency match.

These and other objectives of the present invention will no doubt become obvious to those of ordinary skill in the art after reading the following detailed description of the preferred embodiment that is illustrated in the various figures and drawings.

DETAILED DESCRIPTION

The invention involves an oscillation-based calibration technique to calibrate the various loop coefficients in a continuous-time delta-sigma converter or modulator. The invention calibrates various stages of a delta-sigma modulator to achieve optimum performance by calibrating various coefficient values associated with various circuit elements in the delta-sigma modulator.

Figure 1:
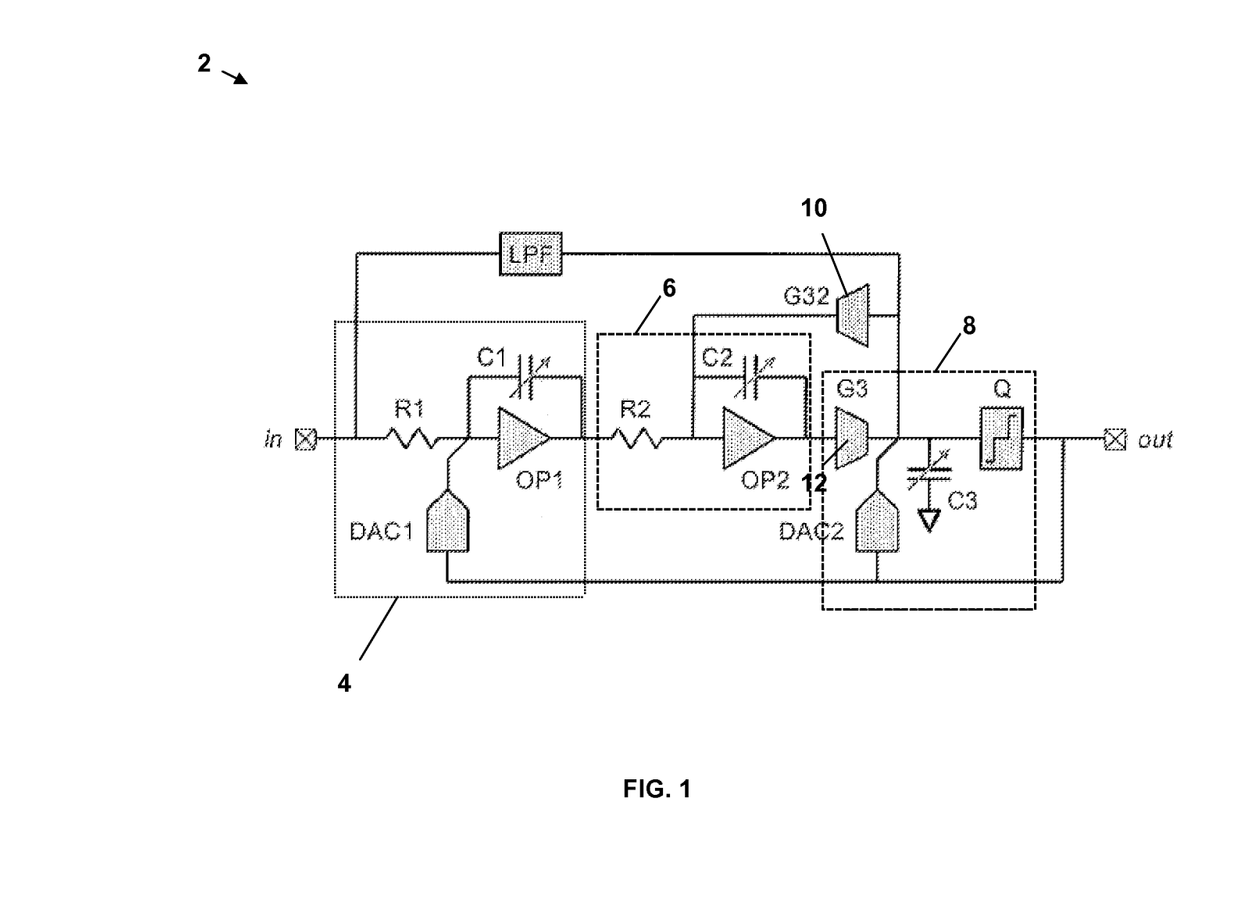
FIG. 1 is a schematic diagram illustrating a delta-sigma modulator used in accordance with the invention.

FIG. 1 is a schematic diagram illustrating a delta-sigma modulator 2 used in accordance with the invention. The delta-sigma modulator 2 is a third order continuous-time delta-sigma modulator. The delta-sigma modulator 2 includes three stages 4, 6, and 8. These stages 4, 6, 8 work together to formulate an optimum modulator. The first stage 4 includes a resistor R1 that is connected to the input of the modulator 2 at one end and connected to the input of an operational amplifier OP1 at the other end. An adjustable capacitor structure C1 is connected to the input and output of the operational amplifier OP1. An input of a digital-to-analog converter (DAC) DAC 1 is connected to the output (out) of the modulator 2 and the output of DAC 1 is connected to the input of the operation amplifier OP1.

The second stage 6 of the modulator 2 includes a resistor R2, an operational amplifier OP2, and an adjustable capacitor C2, where the resistor R2 is connected to the output of the operational amplifier OP1 and the input of the operational amplifier OP2. The adjustable capacitor structure C2 is connected to the input and output of the operation amplifier OP2.

The third stage 8 includes a digital-to-analog converter DAC2, an adjustable capacitor C3, a quantizer Q, and a transconductance amplifier 12, where the DAC2 is connected to the output of the transconductance amplifier 12 and the output signal (out) of the modulator 2. An adjustable capacitor structure C3 is connected to the output of the transconductance amplifier 12 and ground. A quantizer structure Q is connected to the output of the transconductance amplifier 12 and provides the output signal (out) of the modulator 2. Also, the input of a transconductance amplifier 12, having a transconductance coefficient G3, is connected to the output of the operational amplifier OP2. The output of the transconductance amplifier 12 is connected to the input of the transconductance amplifier 10. The output of the transconductance 10 is connected to the input of the operational amplifier OP2. A low pass filter structure (LPF) is connected to the input (in) of the modulator 2 and the input of the transconductance amplifier 10.

For optimum performance of the modulator 2, it is required the capacitors C1, C2 and C3 need to be adjusted so that their respective products with R1, R2, and 1/G3 are accurate. The quantizer Q thresholds need to be reasonably accurate. The coefficients defined by G32/C2 and G3/C2, which are part of a resonator, need to be reasonably accurate. The role of this resonator is to create a notch in the noise transfer function, to help optimize the noise characteristics of the modulator 2.

Figure 2:
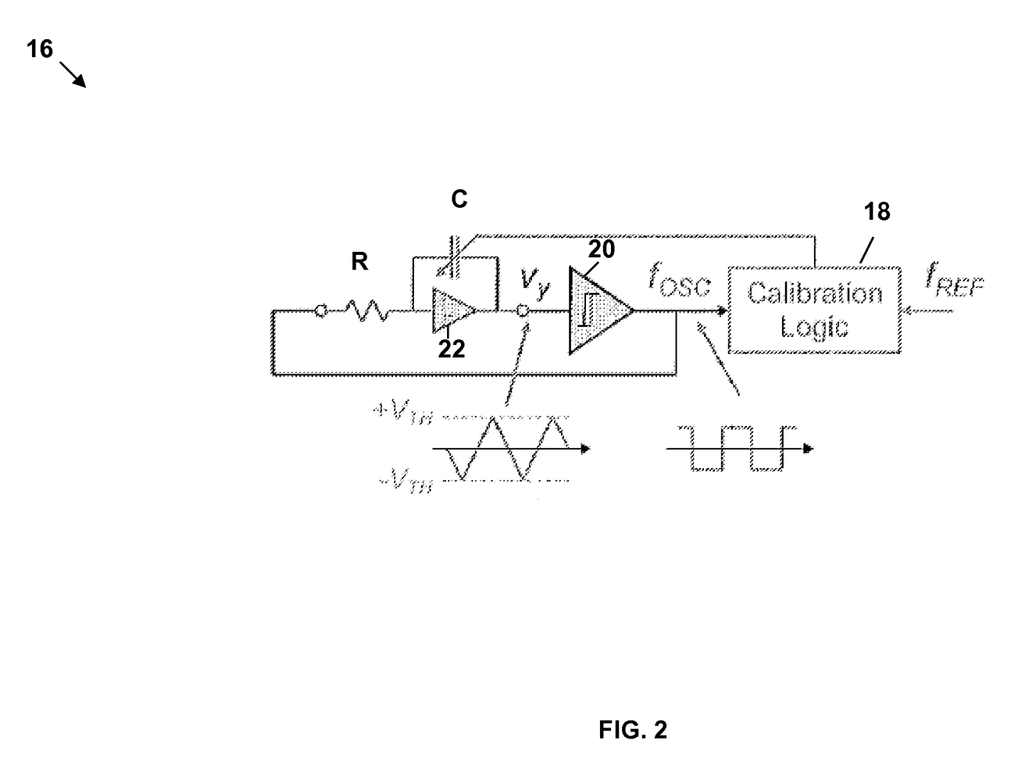
FIG. 2 is a schematic diagram illustrating the calibration technique used in accordance with the invention.

FIG. 2 is a schematic diagram illustrating the calibration technique used in accordance with the invention. The circuit 16 shows a resistor R that is connected to the input of an operational amplifier 22 at one end and at the other end the resistor is connected to the output of a comparator 20. An adjustable capacitor C is connected to the input and output of the operational amplifier 22. A comparator 20 is connected to the output of the operational amplifier 22 and the output of the comparator 20 is input of the integrator. The comparator 20 provides as output a signal having a frequency $f_{osc}$. A calibration logic 18 receives as input the output signal of the comparator with the frequency $f_{osc}$ and a signal having a frequency $f_{REF}$ as well as calibrating the adjustable capacitor structure C.

In this case, the target RC product is configured as an integrator. The comparator 20 reverses the sign of the integrator input when the output Vy crosses the threshold voltages $\pm V_{TH}$. The resulting oscillation has a frequency given by:

$$f_{osc} = \frac{1}{2V_{TH}RC} \qquad \text{EQ. 1}$$

The threshold voltage $V_{TH}$ is derived from an accurate reference voltage, and the oscillation frequency $f_{osc}$ is compared to a reference frequency $f_{REF}$ derived from an accurate oscillator. Assuming these conditions, the RC product can be determined accurately for a given target oscillation frequency.

Figure 3:
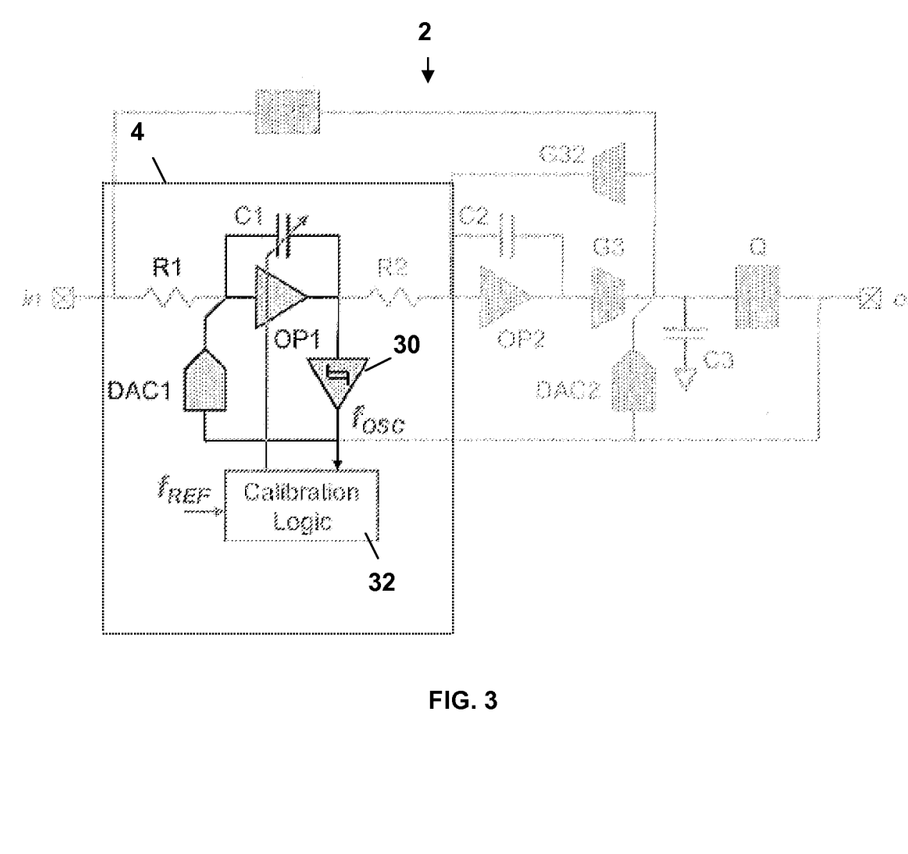
FIG. 3 is a schematic diagram illustrating the calibration technique used in a first stage of a delta-sigma modulator.

The complete calibration technique is applied in multiple steps to the modulator 2, as described herein. The relaxation oscillation-based technique can be readily adapted to the first stage 4 in a modulator, as shown in FIG. 3. Instead of switching the input to resistor R1, a current source in DAC1 is used. The value of this current source is derived from a resistor matched to R1. During this step, the other stages 6, 8 of the modulator 2 are disabled to avoid any influence to the measurement. The calibration logic 32 measures using the comparator 30 the resulting oscillation frequency $f_{osc}$, compares it with the reference frequency $f_{REF}$, and adjusts the value of C1 until they match.

Other stages that have similar implementations to the first stage 4, such as the second stage 6, do not require an independent calibration step. Note the second stage 6 uses an implementation similar to the first stage 4 (in this case, an active-RC integrator). As long as the matching between C2 and C1 is acceptable, the value determined for C1 can be copied directly to C2. If a different implementation is used, in particular a parasitic-sensitive design such as the transconductance-based integrator in third stage 8, the value of C1 can still be copied with a correction factor to account for the extra parasitic capacitances.

The calibration for the third stage 8 is done differently, using the modulator quantizer Q as the calibration comparator. The third stage 8 is more sensitive to parasitics, so using the quantizer Q instead of a dedicated comparator allows for a smaller load on its output, and it also saves area. However, the quantizer Q thresholds are dependent on device matching characteristics, and must be calibrated to the desired accuracy. The calibration of the third stage 8 is done in two steps, a coarse and a fine phase.

Figure 4:
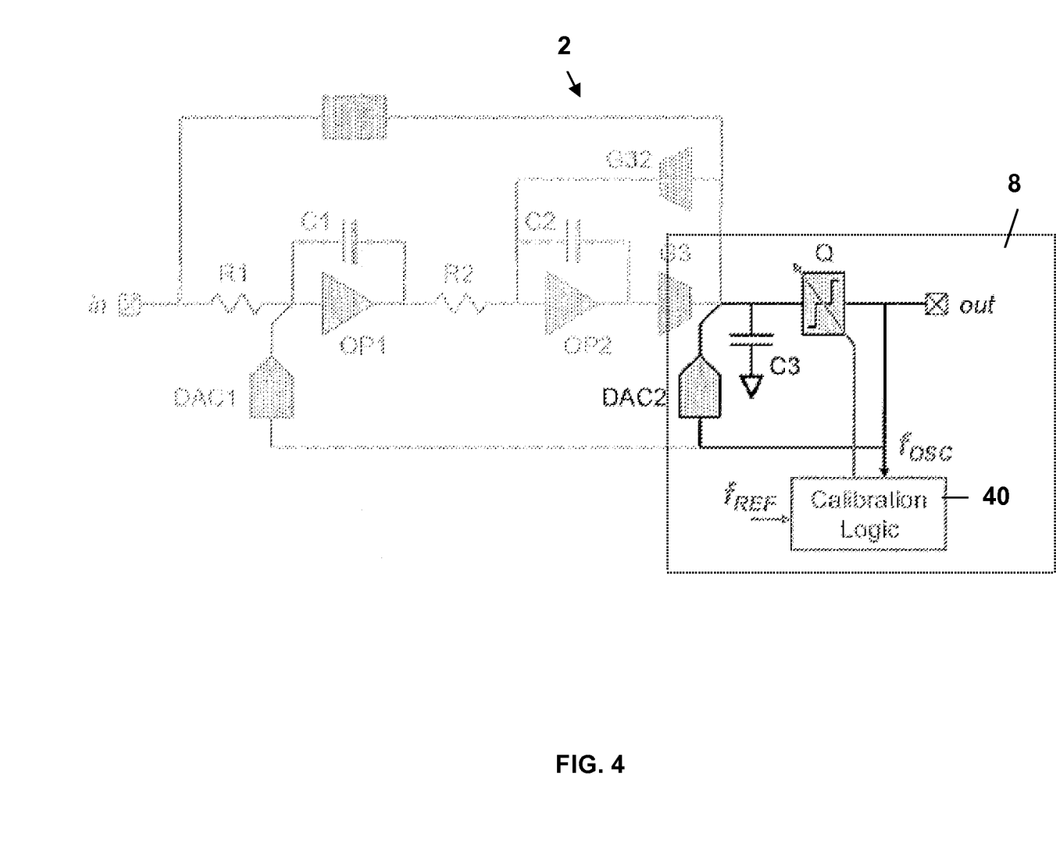
FIG. 4 is a schematic diagram illustrating the calibration of a third stage of a delta-sigma modulator under the coarse phase.

FIG. 4 is a schematic diagram illustrating the calibration of the third stage 8 under the coarse phase. In this arrangement, the DAC 2 receives as input the output signal $f_{osc}$ and the output of the DAC 2 is connected to the adjustable capacitor structure C3. The quantizer Q is connected to the output of DAC 2 and outputs the signal $f_{osc}$. The calibration logic 40 receives as input the signal $f_{osc}$ and the signal $f_{REF}$.

During the coarse phase, the quantizer Q thresholds are calibrated using an initial guess for the value of the C3. The initial guess is obtained from the value previously determined for C1, with a correction factor to account for extra parasitic capacitances. The calibration logic 40 operates in the same way as in the first stage 4.

Figure 5:
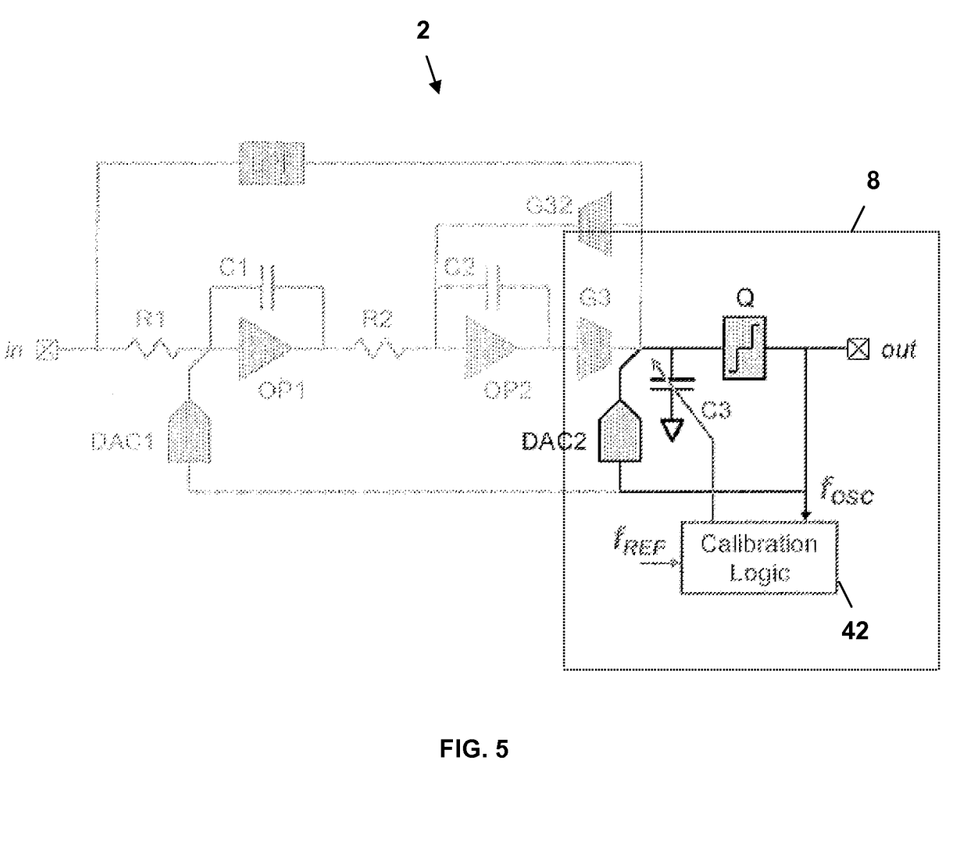
FIG. 5 is a schematic diagram illustrating the calibration of a third stage of a delta-sigma modulator under the fine phase.

FIG. 5 is a schematic diagram illustrating the calibration of the third stage 8 under the fine phase. In this arrangement, the DAC 2 receives as input the output signal $f_{osc}$ and the output of the DAC 2 is connected to the adjustable capacitor structure C3. The quantizer Q is connected to the output of DAC 2 and outputs the signal $f_{osc}$. The calibration logic 42 receives as input the signal $f_{osc}$ and the signal $f_{REF}$.

During the fine phase, the quantizer Q threshold values are fixed, and C3 is trimmed to its final accuracy using the calibration logic 42.

When the calibration of the third stage 8 is completed, the accuracy of the quantizer thresholds is directly mapped to the accuracy of the location of the notch in the noise transfer function. Typically, a larger error is tolerable for this parameter.

Figure 6:
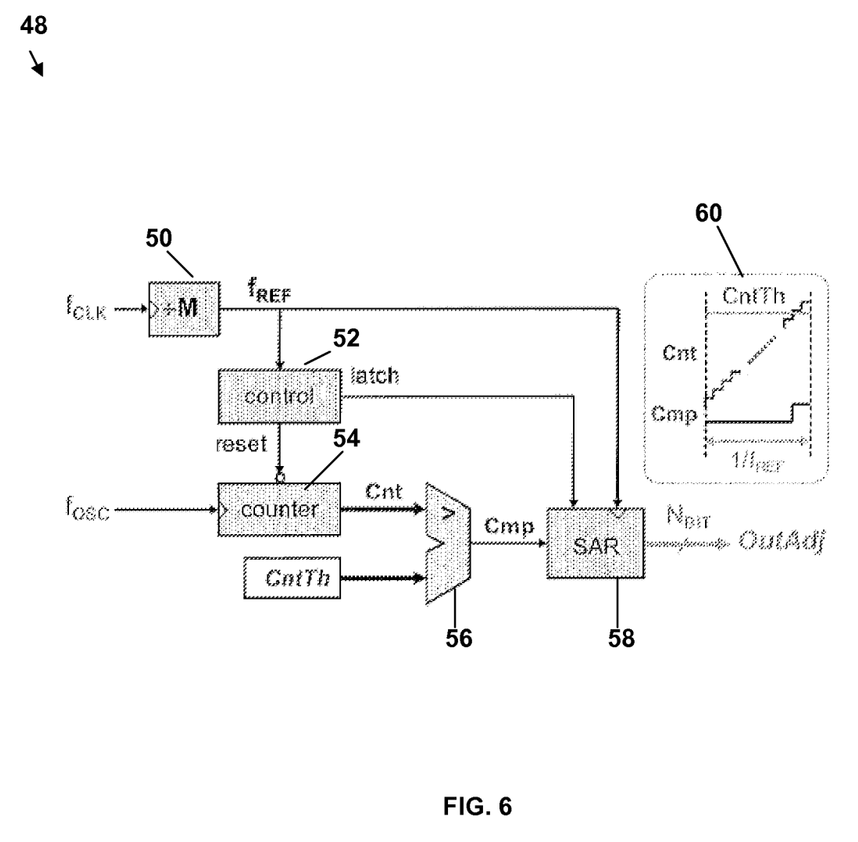
FIG. 6 is a schematic diagram illustrating an implementation of the calibration logic used in accordance with the invention using an oscillation loop structure.

FIG. 6 is a schematic diagram illustrating an implementation of the calibration logic 42 used in accordance with the invention using an oscillation loop structure 48. A divider module 50 receives as input a signal $f_{CLK}$ and performs a division operation. The divider module 50 provides as output the clock signal $f_{REF}$. A control module 52 receives as input the signal $f_{REF}$ and provides two output signals reset and latch. A counter 54 receives the output signal reset and the signal $f_{osc}$ signal as input. The frequency of the relaxation oscillation loop 48 is measured by a counter 54 over the reference period $1/f_{REF}$. At the end of each reference period, the counter 54 output $C_{nt}$ is compared using a comparator 56 to the predetermined threshold $C_{ntTh}$. The successive approximation register (SAR) 58 uses the result of these comparisons $C_{mp}$ to determine the optimum value of OutAdj, used to control the capacitor values or the quantizer thresholds. The value of $C_{ntTh}$ depends on the reference frequency and should include a correction factor to compensate for propagation delays in the analog circuits. If a different set of coefficient values is desired, for example, to configure the modulator for a different operation mode, that can be accomplished by using a different set of $C_{ntTh}$ values. Also, the inset 60 illustrates the relationship between the signals $C_{nt}$, $C_{mp}$, and $C_{ntTh}$.

A nonideal effect that can significantly affect the calibration accuracy is the presence of offset currents. In the invention, this can be an issue for the third stage 8. Offset currents originating in G3 and DAC 2 cause the waveform at the output of the integrator to become asymmetric, and the signal $f_{osc}$ to deviate from a 50% duty-cycle. This effect can be quantified as an error in the oscillation frequency, which is defined as:

$$\varepsilon_{fosc} = \frac{I_{OFS}^2}{I_{DAC}^2 - I_{OFS}^2}. \quad \text{EQ. 2}$$

Figure 7:
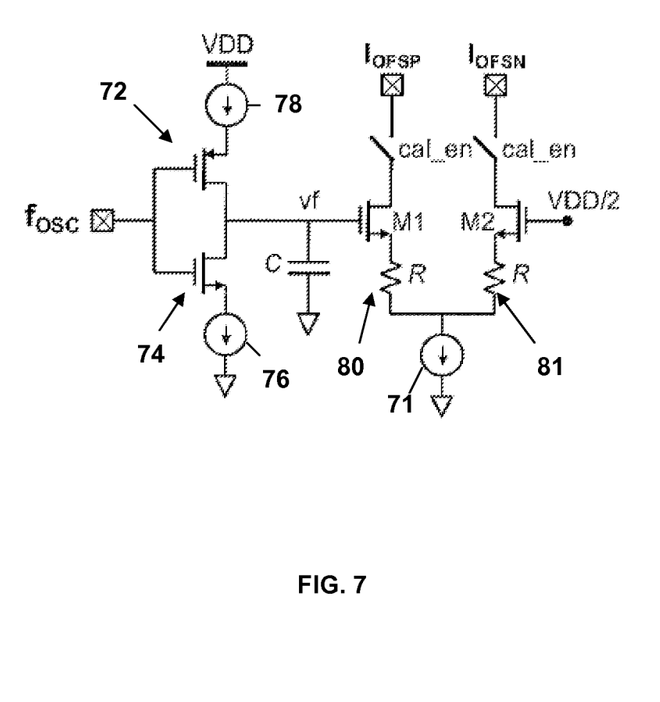
FIG. 7 is a schematic diagram illustrating an offset cancellation circuit used in accordance with the invention.

FIG. 7 is a schematic diagram illustrating an offset cancellation circuit 70 used in accordance with the invention. The offset cancellation circuit 70 receives as input the oscillation signal $f_{osc}$. The gate of a FET 74 receives as input the signal $f_{osc}$. The source of the FET 74 is connected to a current source 76. The current source 76 is also connected to ground. The gate of a FET 72 receives as input the signal $f_{osc}$. The drain of the FET 72 is connected to a voltage source VDD. The source of the FET 72 is connected to the drain of the FET 74. A capacitor structure C is connected at one end to the drain of the FET 74 and on the other end ground. The gate of a MOSFET M1 is connected to the drain of the FET 74. The drain of the MOSFET M1 is connected to current $I_{OFSP}$. A switch cal_en is positioned between the MOSFET M1 and the current $I_{OFSP}$. The source of MOSFET M1 is connected to a resistor element 80 having a resistor value of R. Also, the resistor element 80 is connected to a current source 71. The current source 71 is also connected to ground. The drain of MOSFET M2 is connected to current $I_{OFSN}$. The gate of MOSFET M2 is connected to a voltage source VDD/2. A second switch cal_en is positioned between the MOSFET M2 and the current $I_{OFSN}$. The source of MOSFET M2 is connected to a resistor element 81 having a resistor value of R. Also, the resistor R is connected to the current source 71.

Figure 8:
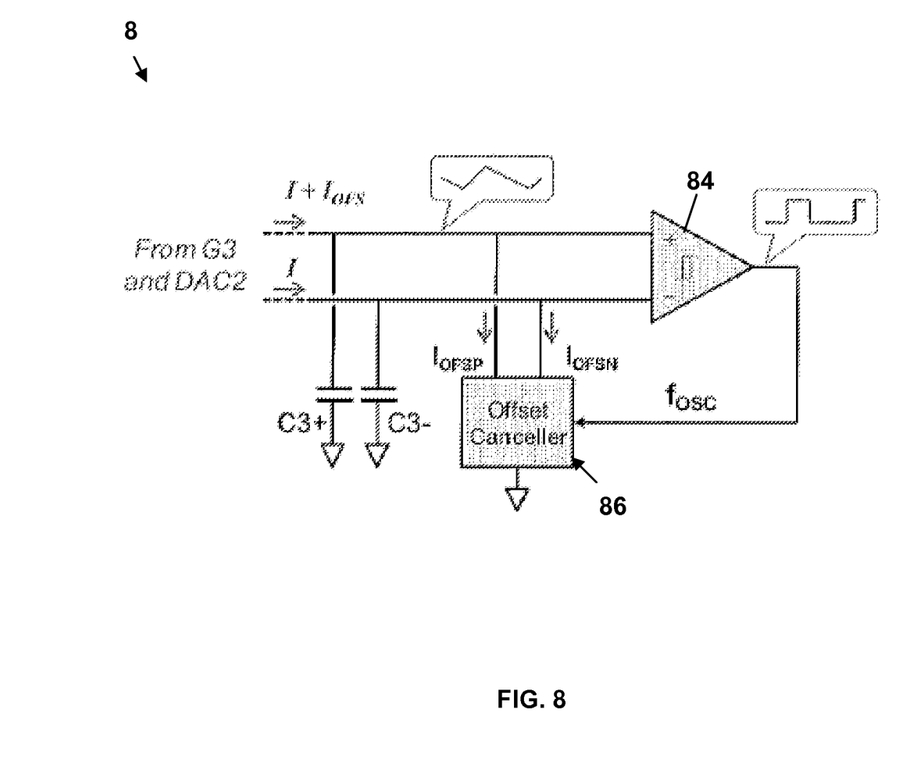
FIG. 8 is a schematic diagram illustrating the offset cancellation circuit offsetting offset currents in a third stage of a delta-sigma modulator.

FIG. 8 is a schematic diagram illustrating the offset cancellation circuit 86 offsetting offset currents in the third stage 8 of a delta-sigma modulator. In particular, FIG. 8 shows using the offset cancellation circuit 86 providing the currents $I_{OFSP}$ and $I_{OFSN}$ as outputs, and the oscillation frequency signal $f_{osc}$. An operational amplifier 84 receives at its non-inverting and inverting inputs a signal that includes a current I+$I_{OFS}$, where $I_{OFS}$ is associated with the offset currents that are produced by the transconductance G3 and DAC 2 of the third stage 8 in addition from the capacitor elements C3+ and C3−. The comparator 84 outputs the signal $f_{osc}$ to the offset cancellation circuit 86. The offset cancellation circuit 86 uses the differential currents $I_{OSFP}$ and $I_{OFSN}$ to remove the effect of the $I_{OFS}$ current in the calibration measurements.

Although the present invention has been shown and described with respect to several preferred embodiments thereof, various changes, omissions and additions to the form and detail thereof, may be made therein, without departing from the spirit and scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit for calibrating selective coefficients of a delta-sigma modulator comprising:
a calibration logic module that is coupled to one of a plurality of stages of the delta-sigma modulator, the calibration logic module measures the oscillating frequency of a respective stage and compares it to a reference frequency, the calibration logic adjusts a selective circuit component associated with the respective stage so that the reference frequency and the oscillating frequency match;
wherein one of the stages at least comprises a quantizer, and the calibration logic module performs calibration on the quantizer so as to match the reference frequency and the oscillating frequency of that stage.

2. The circuit of claim 1, wherein one of the stages comprises an RC-based integrator arrangement.

3. The circuit of claim 2, wherein the calibration logic module adjusts a capacitor element of the RC product so as to match the reference frequency and the oscillating frequency of that stage.

4. The circuit of claim 1, wherein that stage further comprises a digital-to-analog converter (DAC) and capacitive element.

5. The circuit of claim 4, wherein the calibration logic module performs calibration on the capacitive element so as to match the reference frequency and oscillating frequency of that stage.

6. The circuit of claim 3, wherein the oscillating frequency is produced from the output of an integrator coupled to that stage.

7. The circuit of claim 1, wherein the oscillating frequency is produced from the output of the quantizer.

8. The circuit of claim 1, wherein the calibration logic module calibrates the quantizer thresholds using an initial value for the capacitive element based on a previous calibration result.

9. The circuit of claim 5, wherein the calibration logic module calibrates the capacitive element while maintaining the thresholds of the quantizer fixed.

10. The circuit of claim 4 further comprising an offset cancellation circuit that removes offsetting currents produced by that stage and by other stages that are connected to it.

11. A method of calibrating selective coefficients of a delta-sigma modulator comprising:
receiving an oscillating frequency of a respective stage and a reference frequency;
coupling a plurality of stages of the delta-sigma modulator to a calibration logic module, the calibration logic module measures the oscillating frequency of the respective stage and compares it to the reference frequency, the calibration logic adjusts a selective circuit component associated with the respective stage so that the reference frequency and the oscillating frequency match;
wherein one of the stages at least comprises a quantizer, and the calibration logic module performs calibration on the quantizer so as to match the reference frequency and the oscillating frequency of that stage.

12. The method of claim 11, wherein one of the stages comprises a RC-based integrator arrangement.

13. The method of claim 12, wherein the calibration logic module adjusts a capacitor element of the RC product so as to match the reference frequency and the oscillating frequency of that stage.

14. The method of claim 11, wherein that stage comprises a digital-to-analog converter (DAC) and capacitive element.

15. The method of claim 14, wherein the calibration logic module further performs calibration on the capacitive element so as to match the reference frequency and oscillating frequency of that stage.

16. The method of claim 13, wherein the oscillating frequency is produced from the output of an integrator coupled to that stage.

17. The method of claim 11, wherein the oscillating frequency is produced from the output of the quantizer.

18. The method of claim 11, wherein the calibration logic module calibrates the quantizer thresholds using an initial value for the capacitive element based on a previous calibration result.

19. The method of claim 15, wherein the calibration logic module calibrates the capacitive element while maintaining the thresholds of the quantizer fixed.

20. The method of claim 14 further comprising an offset cancellation method that removes offsetting currents produced by that stage and other stages that are connected to it.

21. The circuit of claim 1, wherein the quantizer is used as a calibration comparator.

22. The circuit of claim 4, wherein the calibration logic module calibrates a threshold of the quantizer so as to match the reference frequency and the oscillating frequency of that stage, and after the quantizer is calibrated, the calibration logic module further calibrates the capacitive element while maintaining the threshold of the quantizer fixed.

* * * * *